United States Patent
Ausserlechner et al.

(10) Patent No.: US 9,562,954 B2
(45) Date of Patent: Feb. 7, 2017

(54) MAXIMIZATION OF TARGET SIGNAL AND ELIMINATION OF BACKBIAS COMPONENT FOR A DIFFERENTIAL UPRIGHT POSITION SENSOR

(71) Applicant: Infineon Technologies AG, Neubiberg (DE)

(72) Inventors: Udo Ausserlechner, Villach (AT); Tobias Werth, Villach (AT)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 14/453,347

(22) Filed: Aug. 6, 2014

(65) Prior Publication Data

US 2016/0041235 A1    Feb. 11, 2016

(51) Int. Cl.
*G01D 5/14* (2006.01)
*G01R 33/02* (2006.01)

(52) U.S. Cl.
CPC .............. *G01R 33/02* (2013.01); *G01D 5/145* (2013.01)

(58) Field of Classification Search
CPC ............. G01B 7/14; G01B 7/30; G01D 5/145; G01D 18/008; G01P 3/487; G01P 21/02; G01R 15/20; G01R 21/08; G01R 33/02; G01R 33/0035; G01R 33/06; G01R 33/07; G01R 33/077; G01R 33/09; G01R 33/095; G01R 33/20; G01R 35/00
See application file for complete search history.

(56) References Cited

U.S. PATENT DOCUMENTS

| | | | |
|---|---|---|---|
| 2007/0290704 A1* | 12/2007 | Shyh ..................... | H01L 22/20 324/762.03 |
| 2009/0001965 A1* | 1/2009 | Ausserlechner ....... | G01D 5/145 324/202 |

* cited by examiner

*Primary Examiner* — Son Le
(74) *Attorney, Agent, or Firm* — Schiff Hardin LLP

(57) ABSTRACT

Embodiments relate to sensor device configurations. In one embodiment, a sensor device comprises a bias magnet, a field sensor die, a first set of one or more magnetic field sensor elements, a second set of one or more magnetic field sensor elements, a memory, and circuitry. The sensor device is configured to combine the sensed magnitudes from each of the magnetic field sensor elements of the first set to obtain a first set output, trim the sensed magnitudes from each of the one or more magnetic field sensor elements of the second set with one of the set of trim values to obtain a second set output, and combine the second set output with the first set output to provide an output signal.

17 Claims, 10 Drawing Sheets

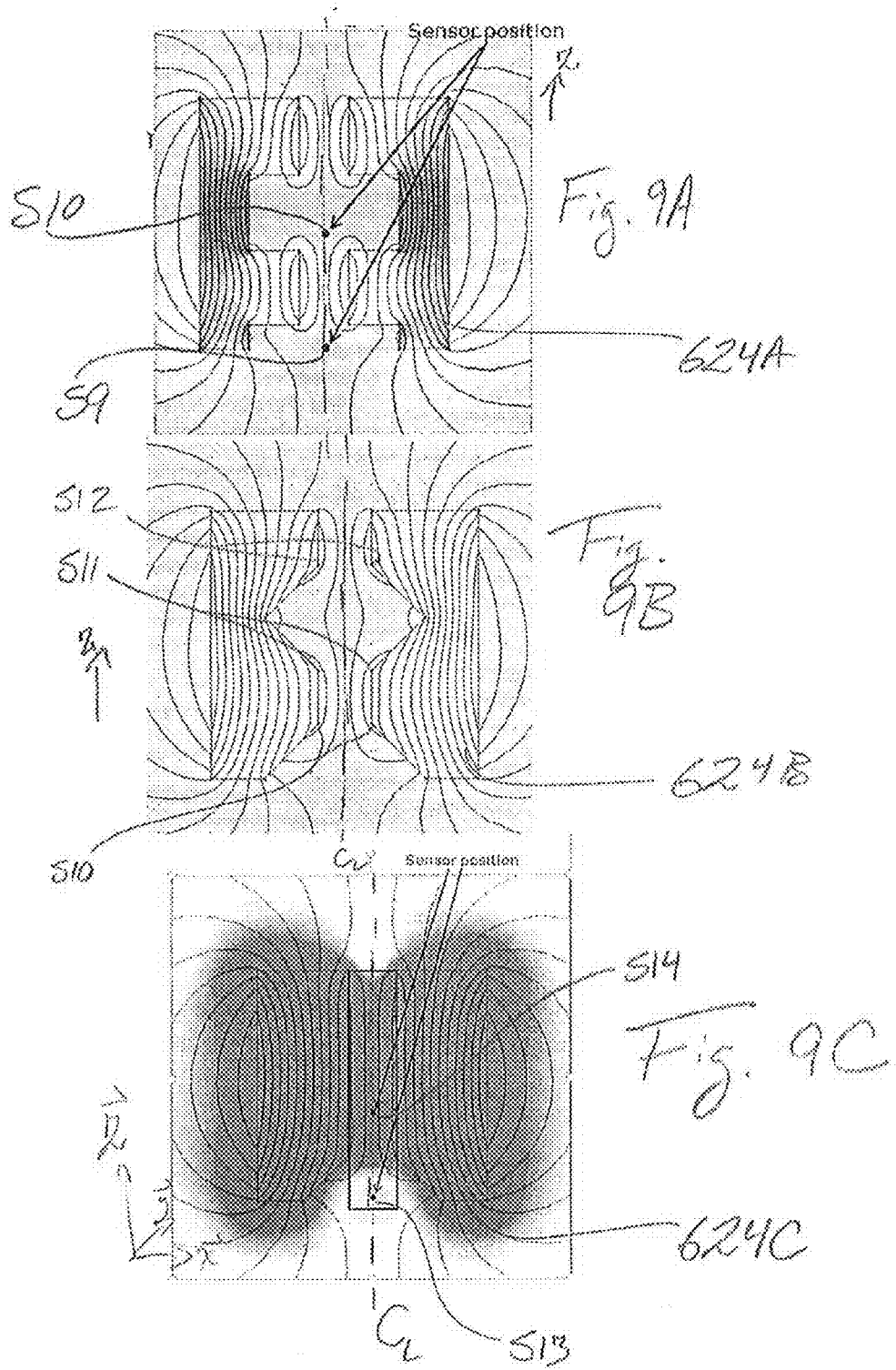

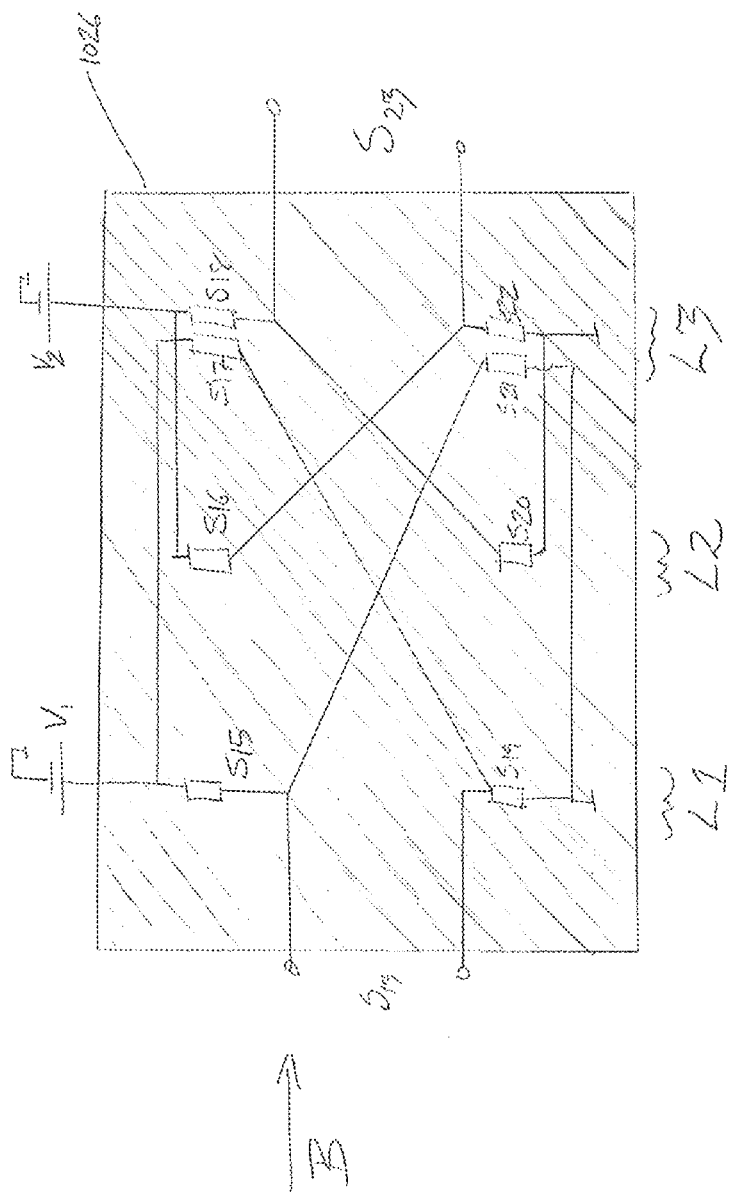

MAXIMIZATION OF TARGET SIGNAL AND ELIMINATION OF BACKBIAS COMPONENT FOR A DIFFERENTIAL UPRIGHT POSITION SENSOR

TECHNICAL FIELD

Embodiments relate generally to magnetic field sensors, and more particularly to configurations and arrangements of upright magnetic field position sensors and related methods.

BACKGROUND

Various conventional sensors measure the magnitude of a magnetic field. Some such sensors measure magnetic field perpendicular to the body of the sensor (e.g., Hall effect sensors) while others measure magnetic field in-plane (e.g., magnetoresistive sensors). Magnetoresistive sensors (xMR sensors) include Anisotropic Magnetoresistive (AMR) sensors, Giant MagnetoResistive (GMR) sensors, Colossal MagnetoResistive (CMR) sensors, and Tunneling MagnetoResistive (TMR) sensors, among others. Often, xMR sensors are multilayer devices which include a sensing layer that is susceptible to magnetization by an external magnetic field, but does not retain such magnetization when the external magnetic field is removed. A resistance of the xMR sensor changes as the magnetization of the sensing layer is oriented by the magnetic field.

Linear position sensors often use a bias magnet and a sensor device arranged near a target. The bias magnet creates a magnetic field through the sensor device and the target. The soft magnetic target has a large relative magnetic permeability (often larger than 300, preferably larger than 1500 or 4000) so that it is efficiently magnetized by the magnetic field of the bias magnet, and generates a responding magnetic field with field strength proportional to its proximity to the bias magnet. The sensor device can include xMR sensors such as those described above. Often, the target has a geared or toothed outer edge, such that the magnetic field generated by the target fluctuates as teeth and gaps on the surface of the target pass beneath the bias magnet. Where the tooth spacing of the target is known, the speed of the target can be determined by measuring the frequency of the fluctuations in magnetic field measured by the sensor package.

Conventional position sensors must distinguish between a magnetic field caused by the bias field source and the field that is related to the position of the target. Often, the bias field is much larger than the target field, and fluctuations in the magnetic field from surrounding devices can complicate accurate measurement of target position.

SUMMARY

Embodiments relate to sensor devices and methods for the use of sensor devices.

In an embodiment, a sensor system comprises a bias magnet configured to generate a bias magnetic field contribution to a total magnetic field, and at least one sensor die mechanically coupled to the bias magnet. The sensor system comprises a first set of one or more magnetic field sensor elements arranged on the at least one sensor die, wherein each of the one or more magnetic field sensor elements of the first set is configured to sense the total magnetic field in a first direction. The sensor system further comprises a second set of one or more magnetic field sensor elements arranged on the at least one sensor die and separated from the magnetic field sensor elements of the first set by a distance, wherein each of the one or more magnetic field sensor elements of the second set is configured to sense the total magnetic field in the first direction. A memory is configured to store a set of trim values, and a circuitry is configured to provide an output signal.

In an embodiment, a magnetic field sensing system includes at least one sensor die, a bias magnet, first and second sets of one or more magnetic field sensor elements, a memory, circuitry, and a target. The bias magnet is configured to generate a bias magnetic field contribution to a total magnetic field. The bias magnet and the at least one sensor die are mechanically coupled. The first set of one or more magnetic field sensor elements is arranged on a first surface of the at least one sensor die, and each of the first set of one or more magnetic field sensor elements is configured to sense the total magnetic field in a first direction. The second set of one or more magnetic field sensor elements arranged on a second surface of the at least one sensor die and spaced apart from the magnetic field sensor elements of the first set, and each of the second set of one or more magnetic field sensor elements is configured to sense the total magnetic field in the first direction. The memory is configured to store a set of trim values. The circuitry is configured to combine the sensed magnetic fields from each of the one or more magnetic field sensor elements of the first set to form a first set output, and multiply the sensed magnetic fields of at least one of the one or more magnetic field sensor elements of the second set by at least one of the set of trim values and derive a second set output therefrom. The target is separated by a distance from the at least one field sensor dies, such that the sensed magnetic field related to the target has a first field value at the first set of one or more magnetic field sensor elements and a second field value at the second set of one or more magnetic field sensor elements.

In an embodiment, a method of calibrating a magnetic sensor includes generating a first sensor set signal, by sensing a total magnetic field at each of the at least one sensors of a first sensor set. The method further includes combining the sensed magnetic fields of the at least one sensor elements of the first sensor set to form the first sensor set signal. The method further includes generating a second sensor set signal, by sensing the total magnetic field at each of at least one sensor elements of a second sensor set, weighting each of the sensed magnetic fields of the at least one sensor elements of the second sensor set by one of the set of trim values, and combining the weighted magnetic fields of the at least one sensor elements of the second sensor set to form the second sensor set signal. The method further includes combining the first sensor set signal and the second sensor set signal to generate an output signal.

BRIEF DESCRIPTION OF THE DRAWINGS

The invention can be more completely understood in consideration of the following detailed description of various embodiments of the invention in connection with the accompanying drawings, in which:

FIGS. 9A-9C are magnetic field diagrams of twist-insensitive sensor device configurations, according to three embodiments.

FIG. 10 is a partial cross-sectional view of a target wheel and a sensor device having interdigitated field sensors, according to an embodiment While embodiments are amenable to various modifications and alternative forms, specifics thereof have been shown by way of example in the drawings and will be described in detail. It should be understood, however, that the intention is not to be limited to the particular embodiments described. On the contrary, the intention is to cover all modifications, equivalents, and alternatives falling within the spirit and scope of the appended claims.

DETAILED DESCRIPTION

Figure 1:
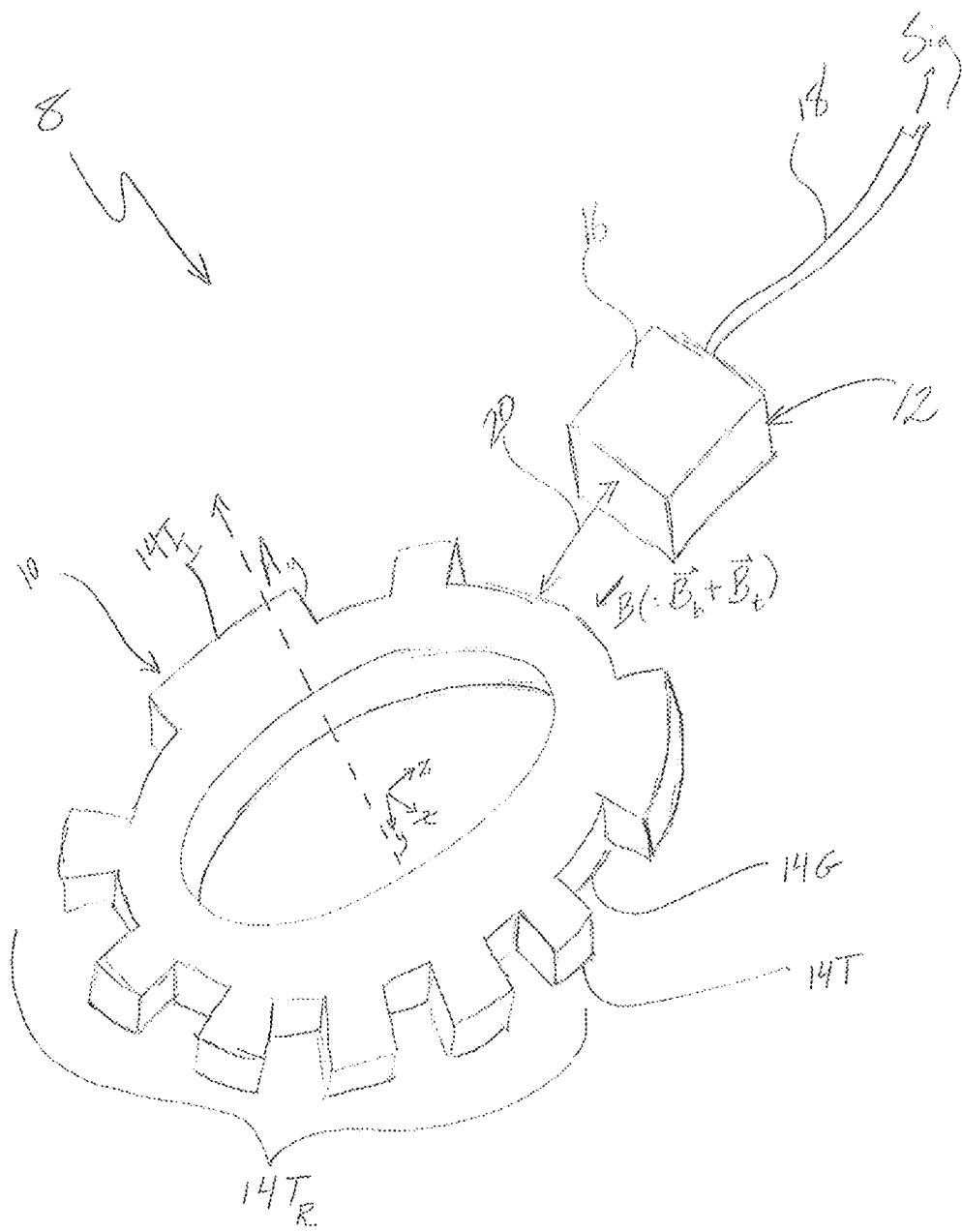
FIG. 1 is a perspective view of a target wheel and a sensor device according to an embodiment.
Figure 2:
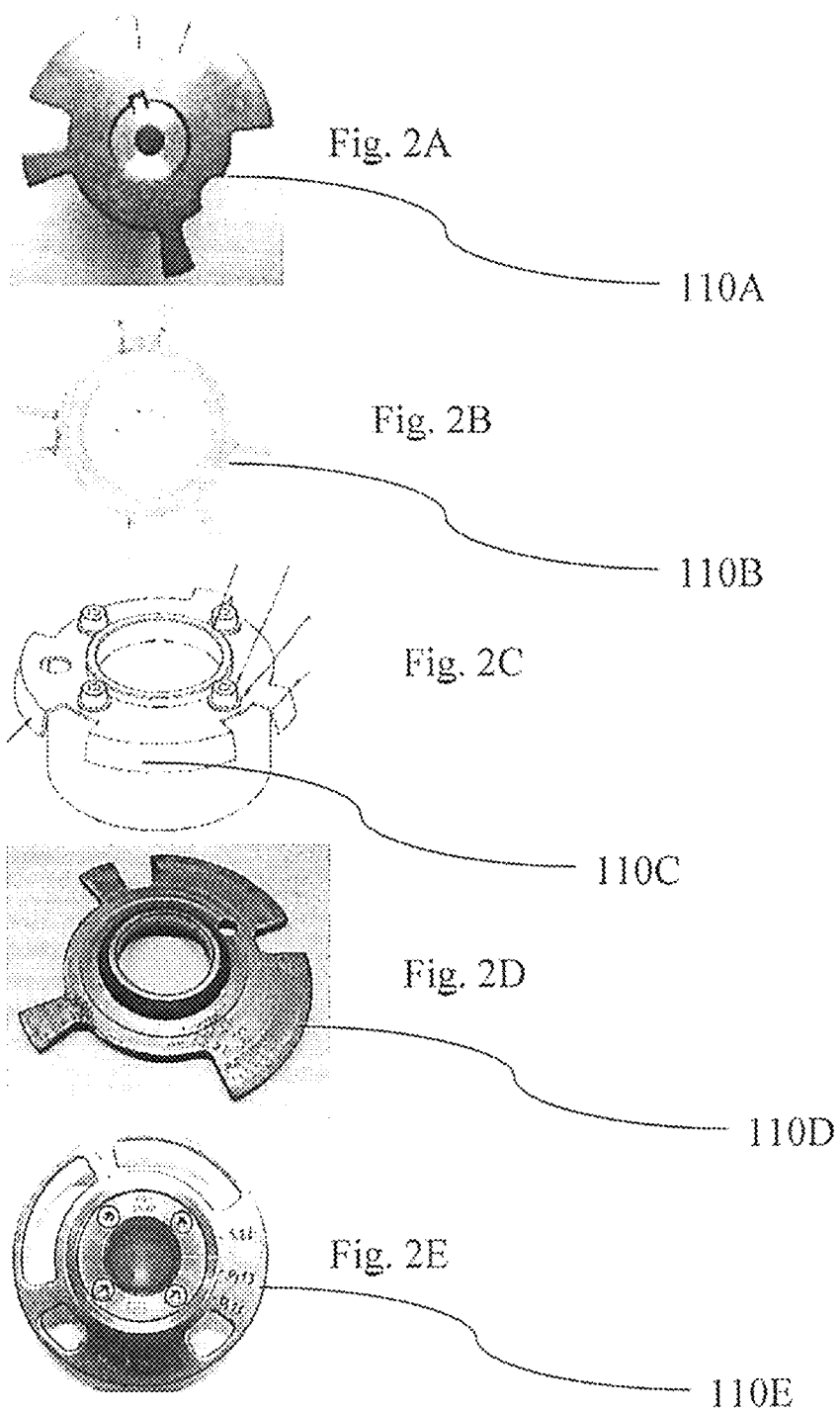
FIGS. 2A-2E are perspective views of target wheels.

In embodiments, a set or several sets of sensors are arranged at varying distances from a target. The outputs of the sensors can be trimmed and combined to suppress a bias contribution to the magnetic field signal while maximizing a target contribution. In some embodiments, the sensors are also arranged in a twist-insensitive mounting configuration. To accomplish twist-insensitivity, the sensors are positioned such that at any given distance from the target, the relative twist in a direction orthogonal to that distance does not affect the final signal reading.

A Cartesian coordinate system, including x, y, and z axes, is used throughout the application, including in the drawings. By convention throughout this application, the z direction is defined as the direction along which the sensor chip(s) and the target are spaced apart. The x direction is often defined as the direction in which the target is traveling as it passes by the sensor. the magnetic field component B is the primary quantity of interest that is being measured by each of the magnetic field sensors in the systems described below. Thereby B denotes a component, which may be $B_x$ or $B_y$ or $B_z$ or any combination thereof. In some embodiments $B_z$ is measured because it is ideal for a twist insensitive sensor. If a twist-insensitive sensor is rotated around the z axis, $B_z$ stays constant while $B_x$ and $B_y$ vary according to the laws of projection. If a twist insensitive design is desired, then the geometry of such the bias magnet used should also have rotational symmetry. The coordinate system shown is used for purposes of clarity only, and should not be construed as limiting in any way. It should be understood that various alternative coordinate systems or arrangements can be used to describe the same or similar systems as those described herein.

FIG. 1 is a perspective view of a magnetic field sensing system 8, including a target wheel 10 and a sensor device 12. Magnetic field sensing system 8 generates signal output Sig, representative of the distance between target wheel 10 and sensor device 12. The frequency of fluctuations in Sig is the same as the frequency at which teeth 14T pass by sensor device 12 (i.e., Sig is a function of the rotational position of target wheel 10 relative to sensor device 12). This frequency can be used to ascertain the rotational speed and/or rotational position of target wheel 10.

Target wheel 10 includes several teeth 14T, including regularly spaced teeth $14T_R$ and irregular teeth $14T_I$. Sensor device 12 can include a housing 16 and at least one lead 18. Air gap 20 is the distance along the z axis between target wheel 10 and sensor device 12. Axis of rotation $A_y$ extends in the y direction only, and passes approximately through the center of gravity of target wheel 10. In some embodiments, target wheel 10 is associated with a cam-shaft sensor. A tooth-notch transition can indicate a specific position of the cylinder head and provide an indication to close or open an inlet/outlet valve for fuel, to trigger the spark for ignition, etc. The number of teeth can correspond to the number of cylinders of the motor.

Target wheel 10 is a rotating component, such as a ring attached to a camshaft or crankshaft. Target wheel 10 is rotatable in the x-z plane about axis of rotation $A_y$. Target wheel 10 can be made of a magnetically soft material, such as a ferromagnetic metal alloy. As such, target wheel 10 has a relatively high magnetic susceptibility, in embodiments. In alternative embodiments, target wheel 10 can be a hard magnetic material with alternating north and south poles arranged along its circumference. In those embodiments, sensor device 12 need not generate any magnetic field, because target wheel 10 generates its own field. In the case of a permanently magnetized target, a bias magnet can be used to bias the magnetic field sensor elements, particularly if they are magneto-resistors. In alternative embodiments, various other targets could be employed that are not target wheels. For example, targets can include drums, discs, or linear geometries like rulers or cograils.

The bias magnet generates a bias field, referred to throughout this application as $B_b$, that can be modulated or influenced by movement of a magnetically susceptible target. This modulation, referred to throughout this application as the target contribution $B_t$, can be sensed and analyzed to determine the position of the target itself. The bias magnet generates a bias field ($B_b$) that magnetizes a soft magnetic target that moves nearby the sensor. This magnetized target generates a target field ($B_t$). Thereby $B_t$ is an indirect consequence of $B_b$ that differs from the immediate/direct bias field $B_b$. Additional background field can also affect total field at any point. Usually, these background fields are substantially homogeneous throughout sensing systems. A background field can be any field generated by the environment exterior to the sensor system that acts as a disturbance and is a possible source of error in the sensor output.

The bias magnet does not only stimulate the target, but can also stabilize the working point of elements within sensor device 12—that is, the bias magnet can provide a sufficient field to activate magnetoresistive elements. Conventionally, a backbias magnet was used to magnetize a moving target wheel. To this end, the target wheel often comprised a soft magnetic material, having a relative magnetic permeability of 300 or more (often 1500 or more). For example, conventional target wheels could be made of ferrous materials. A conventional backbias magnet could also be used to bias the sensing element, for example in the case of a magneto-resistor. As such, the backbias magnet would provide the major part of the field on the sensor element, thereby defining the magnetic working point of the sensor element. The target wheel could then cause small fluctuations of the field around this backbias field. Although similar, relatively permeable target wheels can be used in conjunction with the systems described herein, a bias magnet (not necessarily a backbias magnet because it need not be positioned behind the sensor) can be used with respect to these systems.

Sensor device 12 can include elements that generate magnetic fields, and can also include elements capable of measuring those magnetic fields with contributions from one or more sources. Bias magnetic field $B_b$ emanates from sensor device 12, which contains a bias magnet. Bias magnetic field $B_b$ can be generated by, for example, orienting a permanent magnet to generate a magnetic field having a component in a specific direction (such as e.g. the z direction) at various sensor elements, as described in more detail with respect to FIGS. 4-5.

As previously described, magnetoresistive (xMR) sensor elements, including but not limited to AMR sensors, GMR sensors, CMR sensors, and TMR sensors, can be used to measure magnetic fields. Measurement of magnetic field component B by sensor device 12 can be performed by at least one xMR sensor element (not shown in FIG. 1) contained within housing 16. Depending on the sensor type and reference magnetization direction, various configurations and orientations of xMR sensors can be employed to sense magnetic field along the direction of interest. Furthermore, magnetic field component B can be measured by other magnetic field sensors, such as Hall sensors.

Teeth 14T are arranged on the outer circumferential edge of target wheel 10. Between teeth 14T along the circumference of target wheel 10 are gaps 14G. In the embodiment shown in FIG. 1, teeth 14T are integrally formed with target wheel 10 and extend radially outward from axis of rotation $A_y$, though this need not be the configuration of other target wheels in other embodiments. Regularly spaced teeth $14T_R$ are positioned with regular spacing and size about the circumferential outer edge of target wheel 10. In contrast, irregularly spaced teeth $14T_I$ are not uniformly sized or spaced from one another. Irregularly shaped teeth $14T_I$ create unique signal patterns in magnetic field B that can be used to determine the rotational position of target wheel 10. In alternative embodiments, for example those in which the absolute rotational position of target wheel 10 is unimportant, all of teeth 14T can be regularly spaced teeth $14T_R$. Some additional gear tooth arrangements are shown with respect to FIGS. 2A-2E, and discussed in more detail below.

As target wheel 10 rotates (as indicated by the arrow), teeth 14T pass by sensor device 12 traveling in the positive x direction. Target wheel 10 and sensor device 12 are separated by air gap 20, which is smallest when one of teeth 14T is positioned on the z axis and largest when one of gaps 14G is positioned on the z axis. Sensor device 12 generates a bias magnetic field, $B_b$. In some embodiments, target wheel 10 (including teeth 14T) is magnetically soft, so that the bias magnetic field generated by sensor device 12 magnetizes target wheel 10, generating an induced magnetic field. The induced field is referred to herein as the target contribution, $B_t$, and its component in the z direction at each of the various sensors of sensor package 8 can be measured to ascertain the rotational position of target wheel 10. Magnetic field B as measured by magnetic field sensors of sensor device 12 includes target contribution $B_t$ and bias contribution $B_b$, as well as any background magnetic field along the sensitive direction of sensor device 12.

Target contribution $B_t$ is dependent on the strength of bias contribution $B_b$, the magnetic susceptibility of target wheel 10, and the size of air gap 20. Target contribution $B_t$ is a reaction of the target when being stimulated by the bias contribution $B_b$. By measuring target contribution $B_t$ as target wheel 10 rotates about axis $A_y$, it is possible to ascertain the rotational speed and/or position of target wheel 10 based on the changes in target contribution $B_t$ caused by the travel of teeth 14T and gaps 14G along the x-direction. Bias contribution $B_b$, and any background magnetic field, do not directly provide information regarding the movement of target wheel 10. Therefore, magnetic field sensor system 8 measures total magnetic field B in such a way that it cancels out bias contribution $B_b$ and/or any other background field contributions from the output signal Sig. The various sensor elements within sensor device 12 are arranged and trimmed to generate an output signal Sig representative of only target contribution $B_t$, as described later with respect to FIGS. 4-6.

Magnetic field sensor system 8 is a partially twist-insensitive mounted system if the magnet is magnetized along the twist axis (e.g. z-axis) and if it has no rotational shape. For a completely twist-insensitive system, the bias magnet would have to be rotationally symmetric around the z-axis. In a partially twist-insensitive system, as sensor device 12 is rotated about the z axis, the magnitude and direction of target contribution $B_t$ does not change above a desired amount.

FIGS. 2A-2E are perspective views of target wheels 110A-110E, respectively, having different geometries. A magnetic field can induce magnetization of any of the target wheels 110A-110E of FIGS. 2A-2E, which can in turn produce a target component of magnetic field on a nearby sensor element. In the various embodiments shown, sensor systems can be arranged along the outer radial edge, along a longitudinal edge, or in any other orientation that allows the sensor system to detect the presence, absence, or relative distance to the target wheel (e.g., 110A-110E) as a function of the rotational position of that target wheel.

Figure 3:
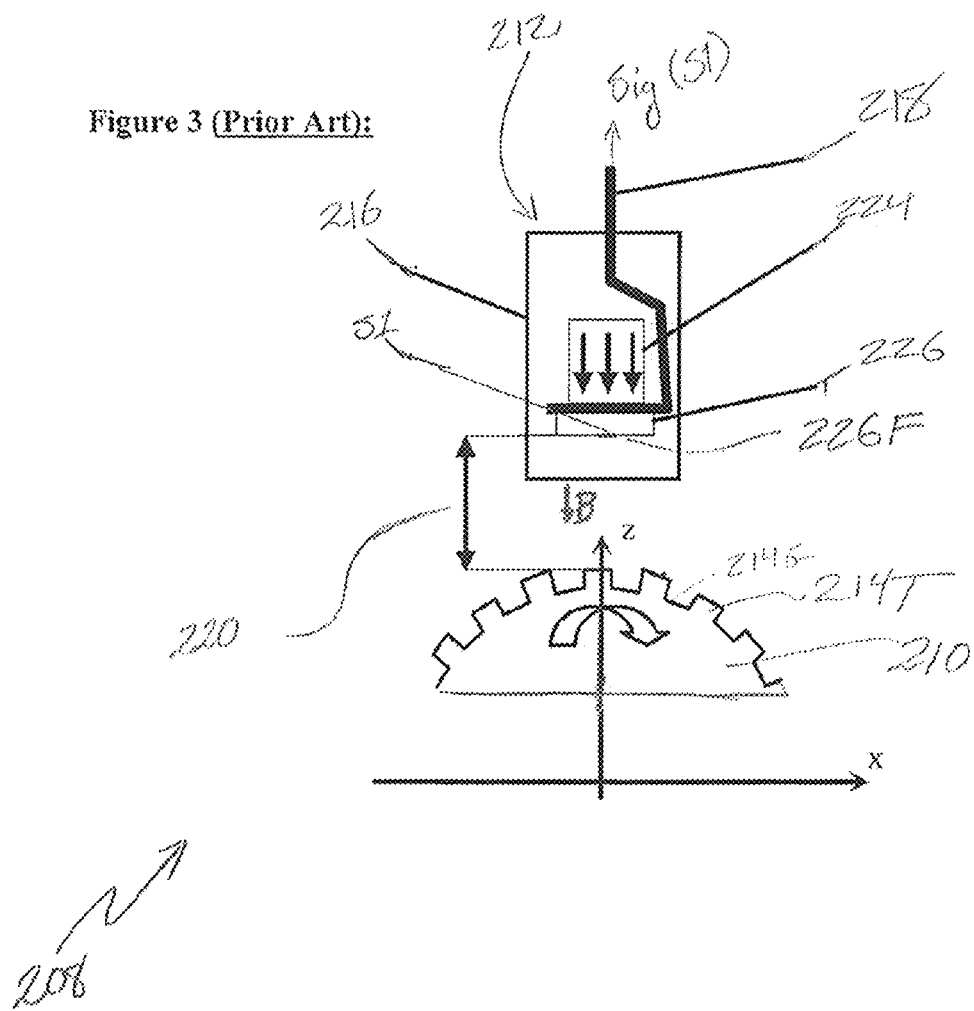
FIG. 3 is a partial cross-sectional view of a prior art target wheel and a conventional magnetic field sensor device.

Conventionally, sensor devices have been arranged on sensor dies facing their target, and a backbias magnet has been positioned opposite the sensors from the target. FIG. 3 illustrates one such conventional arrangement. As described in more detail below, this conventional system has potential for both mechanical and sensing errors.

According to the partial cross-sectional view shown in FIG. 3, conventional magnetic field sensing system 208 includes target wheel 210 and sensor device 212. Sensor device 212 is configured to measure magnetic field in the z direction, which changes depending on the location of teeth 214T and gaps 214G. Sensor device 212 includes housing 216 and leads 218. Target wheel 210 is separated from sensor device 212 by air gap 220. The cross-section of sensor device 212 shown in FIG. 3 further illustrates internal components, including permanent backbias magnet 224, field sensor die 226, and magnetic sensor element 51. Field sensor die 226 defines face 226F, a surface along which magnetic sensor element 51 is arranged.

Conventional magnetic field sensing systems, such as magnetic field sensing system 208, create a magnetic field in the z direction with permanent magnet 224, which induces magnetization of target wheel 210. The magnetization of target wheel 210 can be detected based on changes to the magnetic field in the z direction. Magnetic field sensor die 226 is arranged between permanent magnet 224 and target wheel 210. Field sensor die 226 can be, for example, a semiconductor chip. Magnetic sensor element S1 is positioned on face 226F of field sensor die 226, which extends orthogonal to the z axis.

The arrangement shown in FIG. 3, with face 226F orthogonal to the z axis under permanent magnet 224, requires leads 218 to be bent around permanent magnet 224, resulting in reliability risks for sensor device 212. Magnetic sensor element S1 detects magnetic fields in the z direction caused by any source, including target wheel 210, permanent magnet 224, and any other background field having a z direction component. Often, the backbias magnetic field source (in this case, permanent magnet 224) generates backbias contribution $B_{backbias}$ of a few hundred mT, whereas target contribution $B_t$ generated by target wheel 210 is often only a few mT. Some alternative conventional systems include magnet arrangements that shape the magnetic field in such a way that bias contribution $B_{backbias}$ is small or zero near magnetic sensor element S1, yet still large at target wheel 210 in order to maximize target contribution $B_t$. The arrangement of FIG. 3 is twist-insensitive around the z-axis, in that (i) the sensor location is on the z-axis, (ii) the sensitive direction of the sensor elements is along z and therefore it does not change when the sensor is twisted around z-axis, (iii) the magnet is magnetized along z-direction and therefore the field acting on the target does not change when the sensor package is twisted around z-axis, and (iv) the magnet has rotational symmetry around z-axis so that the field acting on the target does not change when the sensor package is twisted around z-axis.

Figure 4:
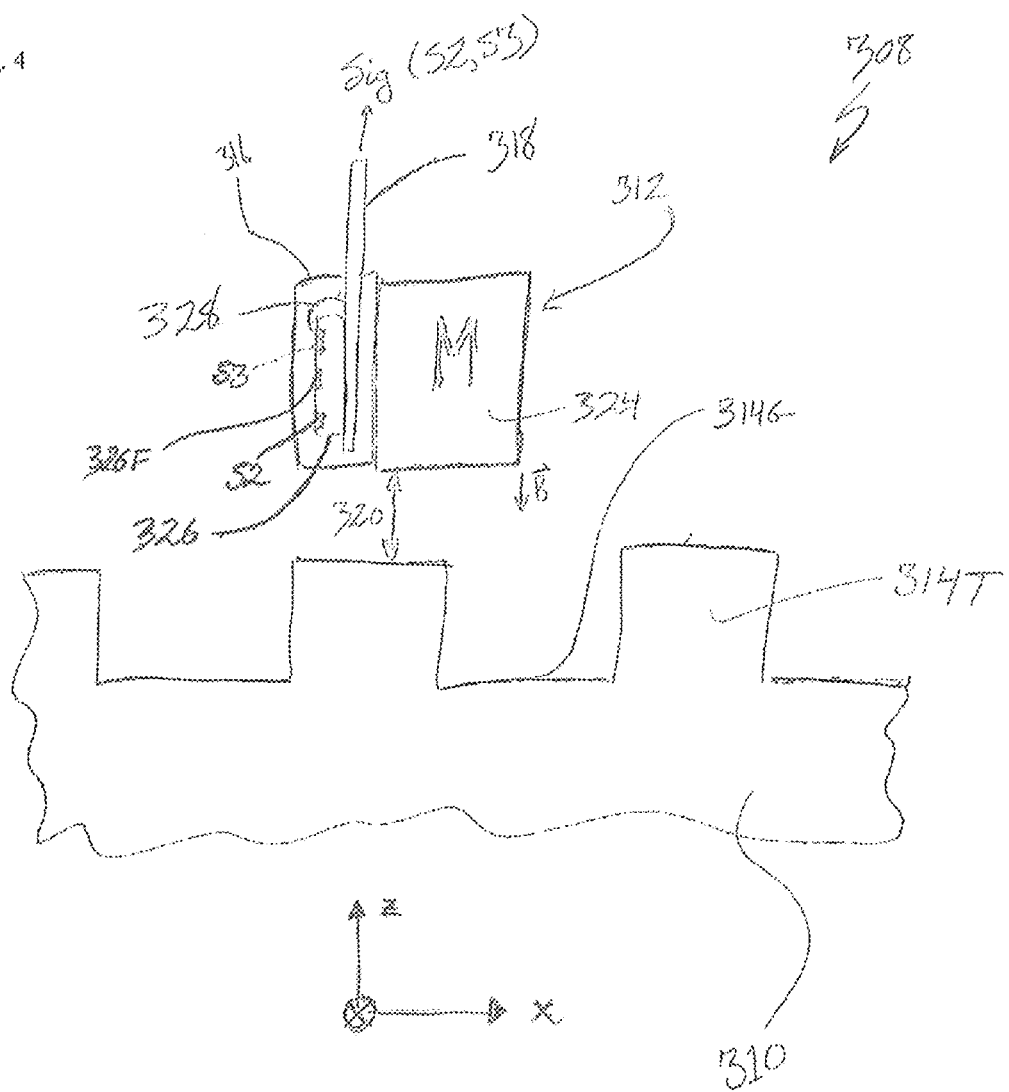
FIG. 4 is a partial cross-sectional view of a target wheel and a sensor device having lower and upper field sensors according to an embodiment.

FIG. 4 is a partial cross-sectional view of magnetic field sensing system 308, which includes target wheel 310 and magnetic field sensor device 312. Target wheel 310 includes teeth 314T and gaps 314G, which travel in the positive x direction when wheel 310 is in motion. In alternative embodiments, and depending on the coordinate system convention used, teeth 314T and gaps 314G could travel exclusively in the positive x direction, exclusively in the negative x direction, or in both positive and negative x directions during any given time period.

Magnetic field sensor device 312 of FIG. 4 includes housing 316, which is mechanically coupled to leads 318 that carry a signal Sig(S2, S3) that is derived from a combination of sensor output signals of sensors S2 and S3 to a remote device such as a controller (not shown). Housing 316 is separated from target wheel 310 along the z axis by air gap 320. The magnitude of air gap 320 is relatively smallest when housing 316 is positioned adjacent to one of teeth 314T, and is relatively largest when housing 316 is positioned adjacent to one of gaps 314G.

Magnetic field sensor device 312 further includes bias magnet 324, magnetic field sensor die 326, lower magnetic field sensor element S2, upper magnetic field sensor element S3, and bond wires 328. Bias magnet 324 can be arranged adjacent to housing 316, and in this embodiment is magnetized at least partially along the z axis. Lower magnetic field sensor element S2 and upper magnetic field sensor element S3 are arranged along face 326F, a surface of field sensor die 326 that extends along the z axis. Lower magnetic field sensor element S2 is arranged closer to target wheel 310 than upper magnetic field sensor element S3. Both lower magnetic field sensor element S2 and upper magnetic field sensor element S3 are connected to leads 318 by bond wires 328.

Although the magnetic field sensor elements S2 and S3 are referred to as "upper" and "lower" with reference to the embodiment illustrated in FIG. 4, in alternative embodiments any first and second sensor elements could be used. The "upper" and "lower" designations are used merely for ease of comparison with the illustration, and it will be understood to one of skill in the art that any first and second magnetic sensor elements that are placed at relative proximate and distant positions from a target or targets can be used to the same effect.

Bias magnet 324 generates bias magnetic field $B_b$. Bias magnet 324 can be a permanent magnet, such as a rare-earth magnet, or alternatively bias magnet 324 can be an electromagnet or some other suitable magnet or magnetic field source. Target wheel 310 is magnetized by bias magnetic field $B_b$ and, as a result, generates target contribution $B_t$. Output signal Sig(S2, S3), which is often representative only of the target contribution $B_t$, is communicated to a remote device such as a controller via leads 318. Target contribution $B_t$ is proportional to the size of air gap 320. For example, target contribution $B_t$ can decay exponentially with the magnitude of air gap 320. As such, the value of target contribution $B_t$ depends on whether a tooth 314T or a gap 314G is positioned adjacent to magnetic field sensor device 312. As target wheel 310 rotates, teeth 314T and gaps 314G move in the positive x direction, and sensor device 312 detects alternating high and low $B_t$ as a result of the alternating procession of teeth 314T and gaps 314G.

In the embodiment shown, bias magnet 324 is attached to the sensor die. In various embodiments, the magnet can be coupled to the sensor die in various alternative ways, including embodiments in which both the magnet and sensor die are attached to a common leadframe next to each other on the same side of the leadframe or on opposite sides of the leadframe, or the sensor die can be covered by a mold and the magnet attached to the mold body, or the magnet can also be attached to the sensor die either on the side facing away from the leadframe or on the side facing towards the leadframe.

Field sensor die 326 is a substrate or other structure that supports both lower magnetic field sensor element S2 and upper magnetic field sensor element S3. In various embodiments, field sensor die 326 can comprise a substrate, a semiconductor die, a leadframe coupled with one or more semiconductor dies, a component board, a combination thereof or some other support structure capable of establishing and/or maintaining an accurate or relative placement of sensors S2 and S3 with respect to each other and/or at least one other component. The field sensing element often comprises first and second sets of sensor elements, and may or may not also include a memory and/or circuitry. The sensor element sets, memory, and circuitry can be distributed amongst any number of dies as desired. For example, in some embodiments, a sensor die can be used having large feature size that allows for large dies (and thus large spacing between first and second sets of sensor elements). In those embodiments, a second die can contain any desired memory or circuitry. For example and simplicity, the term "field sensor die" will generally be used herein throughout but is not limiting with respect to all embodiments and/or the scope of the claims.

In alternative embodiments, lower magnetic field sensor element S2 and upper magnetic field sensor element S3 could be positioned on separate dies or substrates. Lower magnetic field sensor element S2 and upper magnetic field sensor element S3 can be xMR sensors arranged along the y-z plane, such that magnetic field B, including the contributions of bias contribution $B_b$ and target contribution $B_t$, can be detected. In alternative embodiments, magnetic field sensor elements S2 and S3 could be arranged along the x-z plane, or any other orientation. Sensor elements S2 and S3 can alternatively also be Hall plates that detect the x-component or the y-component of the target magnetic field or any combination thereof. In this case the sensor may not be twist-insensitive.

If the bias contribution $B_b$ is removed by combining the sensor element outputs, the target contribution $B_t$ can be calculated directly, as described in Eqs. 1-3, below. The difference in the target contribution at the lower magnetic field sensor, $B_t(S2)$, and the target contribution at the upper magnetic field sensor, $B_t(S3)$, is dependent on the spacing of the lower and upper magnetic field sensor elements S2 and S3. If bias contribution $B_b$ is identical across lower magnetic field sensor element S2 and upper magnetic field sensor element S3, then an output signal Sig(S2, S3) representative of this difference $B_t(S2)$–$B_t(S3)$, can be calculated by directly subtracting the measured components of the two sensor elements.

$$B(S2)-B(S3)=[B_t(S2)+B_b(S2)]-[B_t(S3)+B_b(S3)], \text{ and} \quad [1]$$

$$B_b(S2)=B_b(S3), \text{ therefore} \quad [2]$$

$$B(S2)-B(S3)=B_t(S2)-B_t(S3)=\text{Sig}(S2, S3). \quad [3]$$

Because lower magnetic field sensor element S2 and upper magnetic field sensor element S3 are at different distances from target wheel 310, they measure different target contributions $B_t$, and Sig(S2, S3) is non-zero. The difference between the sensed field components at S2 and S3 varies based on the proximity of a tooth or a gap.

These combinations of sensed magnetic field can be performed by circuitry (not shown). In various embodiments, the combination of the outputs of individual sensor elements (e.g., S2, S3) can be done by simply subtracting the analog outputs of the two elements from one another directly. In other embodiments, various pre-conditioning steps that will be readily understood by those of skill in the art can be implemented in order to facilitate the combination of the outputs of the individual sensor elements with one another into a useful output. For example, in embodiments having many sensor elements that are being combined, various sub-combinations can be made between smaller subsets of the sensor elements. Furthermore, in some embodiments, the outputs of the individual sensor elements can be converted into some other form to be combined, such as by sending those sensed magnetic field signals from the individual sensor elements to an Analog-to-Digital converter. The digital outputs in those embodiments can be readily compared, added, subtracted, or combined in other ways to form a useful output. As will be seen in the embodiments shown in later figures, often several sensor elements are combined into sensor sets, which can be pre-conditioned in similar ways prior to combinations between the sets.

In addition to providing an output signal that is dependent only on target contribution $B_t$, the system shown in FIG. 4 can eliminate the reliability risks related to the bent lead wires previously described with respect to the conventional system shown in FIG. 3.

In alternative embodiments, bias magnet 324 can be arranged within housing 316. Bias magnet 324 can have a complex geometry to create a variety of desired field patterns. For example, bias magnet 324 can be mounted in a twist-insensitive manner, as described in more detail with respect to FIGS. 8A-8C. Additionally or alternatively, bias magnet 324 can be configured to create a magnetic field gradient across lower magnetic field sensor element S2 and upper magnetic field sensor element S3, as described in more detail with respect to FIGS. 7 and 9A-9C. Such a field gradient, however, could cause a breakdown of Eq. 2, and require calibration of lower and upper magnetic field sensor elements S2 and S3. In practice, due to various tolerances the field is strong and different on both lower and upper magnetic field sensor elements S2 and S3, so that the difference Sig(S2, S3) has a large residual bias contribution $B_b$ from bias magnet 324, and a relatively smaller target contribution $B_t$ from target wheel 310. Thus, it can be difficult for magnetic field sensing system 308 to discriminate target contribution $B_t$ from bias contribution $B_b$ for all but the most carefully controlled bias field contributions $B_b$.

Figure 5:
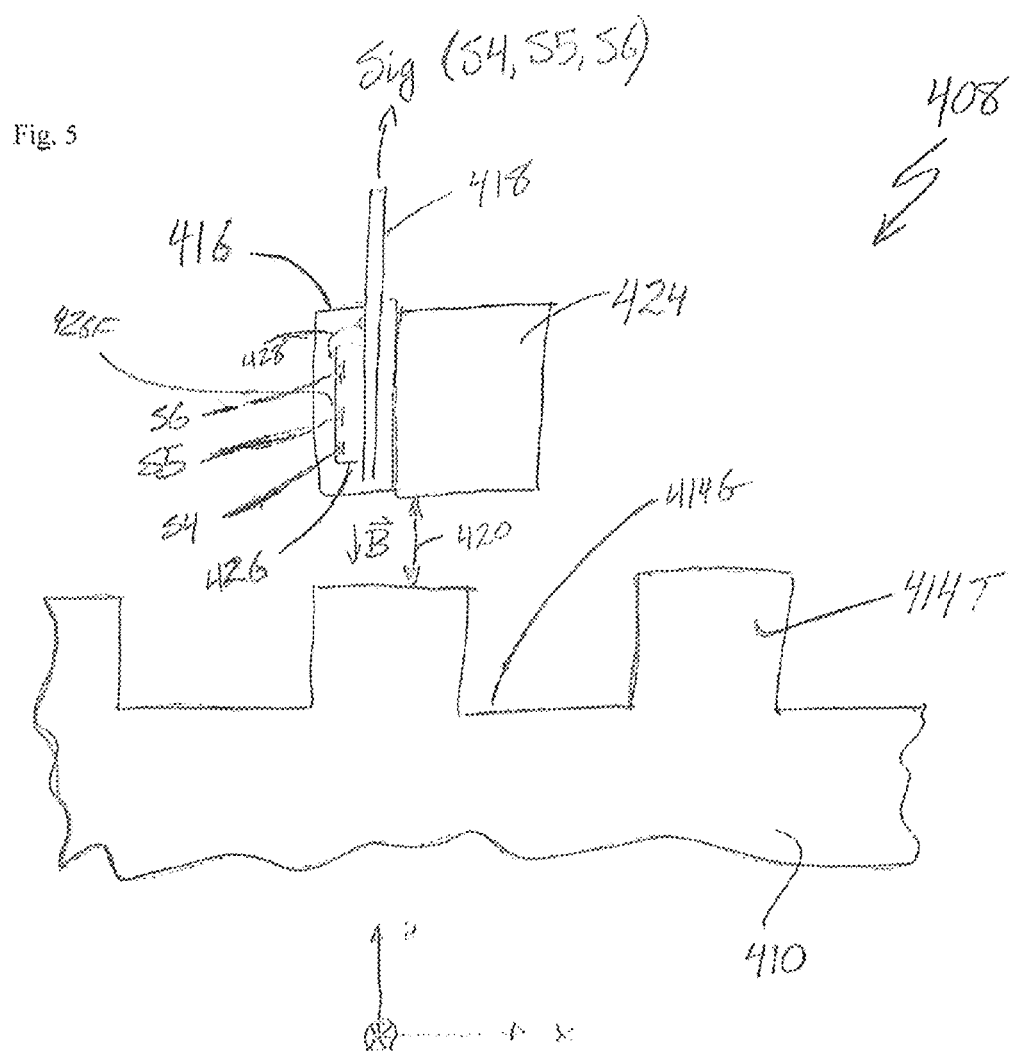
FIG. 5 is a partial cross-sectional view of a target wheel and a sensor device having lower, middle, and upper field sensors, according to an embodiment.

FIG. 5 is a partial cross-sectional view of magnetic field sensing system 408, which includes target wheel 410 and magnetic field sensor device 412. System 408 shown in FIG. 5 is substantially similar to the one previously described with respect to FIG. 4, except that sensor device 412 includes three magnetic field sensor elements S4, S5, and S6 spaced along the z direction instead of two sensor elements. The three magnetic field sensor elements S4, S5, and S6 of system 408 can more accurately discriminate the target contribution $B_t$ from the bias contribution $B_b$, in embodiments. In the embodiment shown in FIG. 5, sensor element S4 is substantially similar to sensor element S2 of FIG. 4. Likewise, in the embodiment shown in FIG. 5, sensor element S6 is substantially similar to sensor element S3 of FIG. 4. Thus, a notable difference between the embodiments shown in these two figures is that the embodiment shown in FIG. 4 includes an additional sensor element, S5, positioned in between the sensor elements S4 and S6.

Sensor device 412 includes housing 416 and leads 418. Housing 416 is spaced from target wheel 410 by air gap 420. Air gap 420 changes with respect to time as teeth 414T and gaps 414G travel past magnetic field sensor device 412 in the positive x direction. Bias magnet 424 generates a bias magnetic field contribution $B_b$, which in turn generates target contribution $B_t$. Face 426F of magnetic field sensor die 426 extends along the z axis, and lower magnetic field sensor element S4, middle magnetic field sensor element S5, and upper magnetic field sensor element S6 are arranged along face 426F. Each of lower, middle, and upper magnetic field sensor elements S4-S6 are sensitive to magnetic fields in the same direction (e.g. the z direction).

Each of the magnetic field sensor elements S4-S6 measures the total magnetic field component B, e.g. in the z direction. Sig(S4, S5, S6) is an output signal dependent solely on the target contribution $B_t$. Sig(S4, S5, S6) is a function of field component B observed at each of lower magnetic field sensor element S4, middle magnetic field sensor element S5, and upper magnetic field sensor element S6.

Each of the measured field components B(S4), B(S5), and B(S6) has a bias contribution $B_b$ and a target contribution $B_t$:

$$\begin{cases} B(S4) = B_b(S4) + B_t(S4) \\ B(S5) = B_b(S5) + B_t(S5) \\ B(S6) = B_b(S6) + B_t(S6) \end{cases} \quad [4]$$

The output signal Sig(S4,S5,S6) can thus be written as $$\text{Sig}(S4,S5,S6)=\text{Sig}_t(S4,S5,S6)+\text{Sig}_b(S4,S5,S6)=B(S4)-x\,B(S5)-(1-x)B(S6)$$

Trim values are used to adjust the output of the various sensors S5-S6. In effect, trimming the outputs of sensor elements S5 and S6 and combining them results in an output that corresponds to a component of the field somewhere in between these two sensors. Adjusting the trim factor applied to each sensor element shifts the gravity center of group consisting of S5 and S6 so that bias field $B_b$ and any background field are cancelled out when combined with the first group. It should be noted that other subsets of sensors can be combined into a trimmed group. For example, sensor elements S4 and S5 could form a trimmed group. Many sensor elements each having an associated trim value can form a group.

Trim values can be used to adjust each sensor (e.g., S5, or S6) individually, in order to modify its performance, and the trim value can be associated with that sensor permanently. Trimming can be performed in a digital or binary manner, in various embodiments, by cutting laser fuses or zapping Zener diodes or melting cavity fuses or programming a flash or an eeprom. Trimming can also be performed in an analog manner by lasing resistor meanders or connecting resistors with adequately chosen resistance values to terminals of a circuit. In alternative embodiments, trim values can be stored as a capacitance, rather than a resistance. Often, the trim value is physically stored in a memory, which is a part of the system. This memory can be readable by the system during operation and it can also be programmable during a calibration procedure. If the optimization of the sensor device is performed by adjusting the sensor elements to a bias magnet, trimming can be done after the bias magnet is mechanically coupled to the sensor elements.

A trim factor x can be chosen and the measured signal from magnetic field sensor elements S4-S6 combined in such a manner that the bias portion of the output signal $Sig_b$(S4, S5, S6) is zero:

$$Sig_b(S4,S5,S6)=B_b(S4)-x\,B_b(S5)-(1-x)B_b(S6)=0 \qquad [5]$$

which corresponds to sampling magnetic field at some intermediate point between S5 and S6. The subtraction of the signal of S4 and the combination of trimmed signals of S5, S6 has the effect of cancelling out any homogeneous background magnetic disturbances. In a calibration procedure x can be adjusted in order to satisfy equation [5]. Often, the bias magnet is configured to achieve magnetic bias fields $B_b$ on sensor elements S4, S5, S6 which produce an x-value close to zero. The value x=0 can be advantageous, because according to Equation [5], the spacing between the two active sensors S4 and S6 is maximized and can give the best sensitivity to the target. In those situations where the bias magnetic field has an even symmetry, such that $B_b(S4)=B_b(S6)$ then x=0. In those embodiments, middle magnetic field sensor S5 can be switched off, saving current drain. In other uses, the bias magnetic field has uneven symmetry and all 3 sensor elements S4-S6 are needed to cancel out the bias contribution in the total signal. This usually happens in practice due to production and assembly tolerances of magnet and sensor.

By rearranging Eq. 5, it can be seen that $$x = \frac{B_b(S4) - B_b(S6)}{B_b(S5) - B_b(S6)} \qquad [6]$$

and trim factor x is zero when bias contributions $B_b(S4)=B_b(S6)$, and infinite as bias contribution $B_b(S6)$ approaches bias contribution $B_b(S5)$. In the case where trim factor x=0, lower and upper magnetic field sensor elements S4 and S6 sense the same magnitude of bias field, and middle magnetic field sensor element S5 is not necessary to cancel out bias field $B_b$.

Trim factor x can be stored in a digital or analog memory of sensor device 412. After the magnet (e.g., magnet 424 of FIG. 5) is attached to the sensor device (e.g., sensor device 412 of FIG. 5), trim factor x can be determined in an end-of-line test as part of the manufacturing process, and can be programmed into a chip (not shown, but in some embodiments the chip could be a part of sensor device 412). Alternatively, trim value x can be programmed into sensor die 426 prior to mounting it in front of a target. For example, resistance between two nodes on sensor die 426 can be modified by lasing to store a trim value as a resistance. In other cases, trim value x can be determined after the mounting of sensor device 412 in front of a target. In that case, the target can be turned to a calibration position, and trim factor x set such that the output signal Sig(S4, S5, S6)=0 at that position. For example, the calibration position can be one in which the center of a tooth or the center of a gap is positioned adjacent to the sensor device along the z axis.

In addition to cancelling out the bias field $B_b$, it can be desirable to maximize the target contribution $B_t$, which is the real value of interest in many cases. Target contribution $B_t$ is dependent on the spacing of each of magnetic field sensor elements S4-S6 from target wheel 410. Target contribution $B_t$ can be smaller at middle magnetic field sensor element S5 than at lower magnetic field sensor element S4, and smaller at upper magnetic field sensor element S6 than at middle magnetic field sensor element S5, due to decay of the magnetic field with distance from target wheel 410. Target contribution on S6, however, can also be as strong as on S5, particularly if they are arranged at the same distance from a target. Some sensor elements need not be at different distances from the target than others—rather, the sensors elements need only be positioned at three or more distances from the target. Target contributions $B_t$ at each sensor can be related by the Eq. 7, below:

$$\begin{cases} B_t(S5) = \varepsilon_{S5} B_t(S4) \\ B_t(S6) = \varepsilon_{S6} B_t(S4) \end{cases} \qquad [7]$$

where $1 > \varepsilon_{S5} > \varepsilon_{S6} > 0$. The component of the output signal attributable to target contribution $B_t$, Sig(S4, S5, S6), can be written as:

$$\begin{aligned} Sig(S4, S5, S6) &= B_t(S4) - xB_t(S5) - (1-x)B_t(S6) \qquad [8] \\ &= B_t(S4)[1 - \varepsilon_{S6} - x(\varepsilon_{S5} - \varepsilon_{S6})]. \end{aligned}$$

From Eq. 8, it is apparent that the signal attributable to the target contribution, Sig(S4, S5, S6), is maximized when the trim factor x is zero.

By spacing three magnetic field sensor elements S4-S6 and trimming S5 and S6 appropriately, an output signal Sig(S4, S5, S6) that is dependent only on the target contribution $B_t$ at each sensor can be generated. Proper trimming not only minimizes or eliminates bias contribution $B_b$ of the magnetic field, but maximizes the signal Sig that is dependent on target contribution $B_t$.

In alternative embodiments, magnet 424 can be composed of several sub-parts. These multiple sub-parts can be magnetized in different directions in order to reduce bias field $B_b$ at specific locations. Additionally or alternatively, sensor device 412 can be over-molded by some magnetic mould compound such that magnetic field sensor elements S4, S5, and S6 are housed inside a magnet. Alternatively or additionally, magnet 424 can have the shape of a general cylinder, wherein the cylinder axis is coincident with the z axis. Flux guides can be used to shape the magnetic field near magnetic field sensor elements S4, S5, and S6. Magnet 424 need not be a permanent magnet, but could instead be an electromagnet. In still further embodiments, magnetic field sensor elements S4, S5, and S6 need not be xMR sensors. For example, magnetic field sensor elements S4, S5, and S6 could be horizontal Hall plates, detecting fields perpendicular to their main surfaces, and these Hall plates can be arranged such that their main surfaces are aligned with the z-axis. In still other embodiments, magnetic field sensor elements S4, S5, and S6 can be vertical Hall effect devices.

Figure 6:
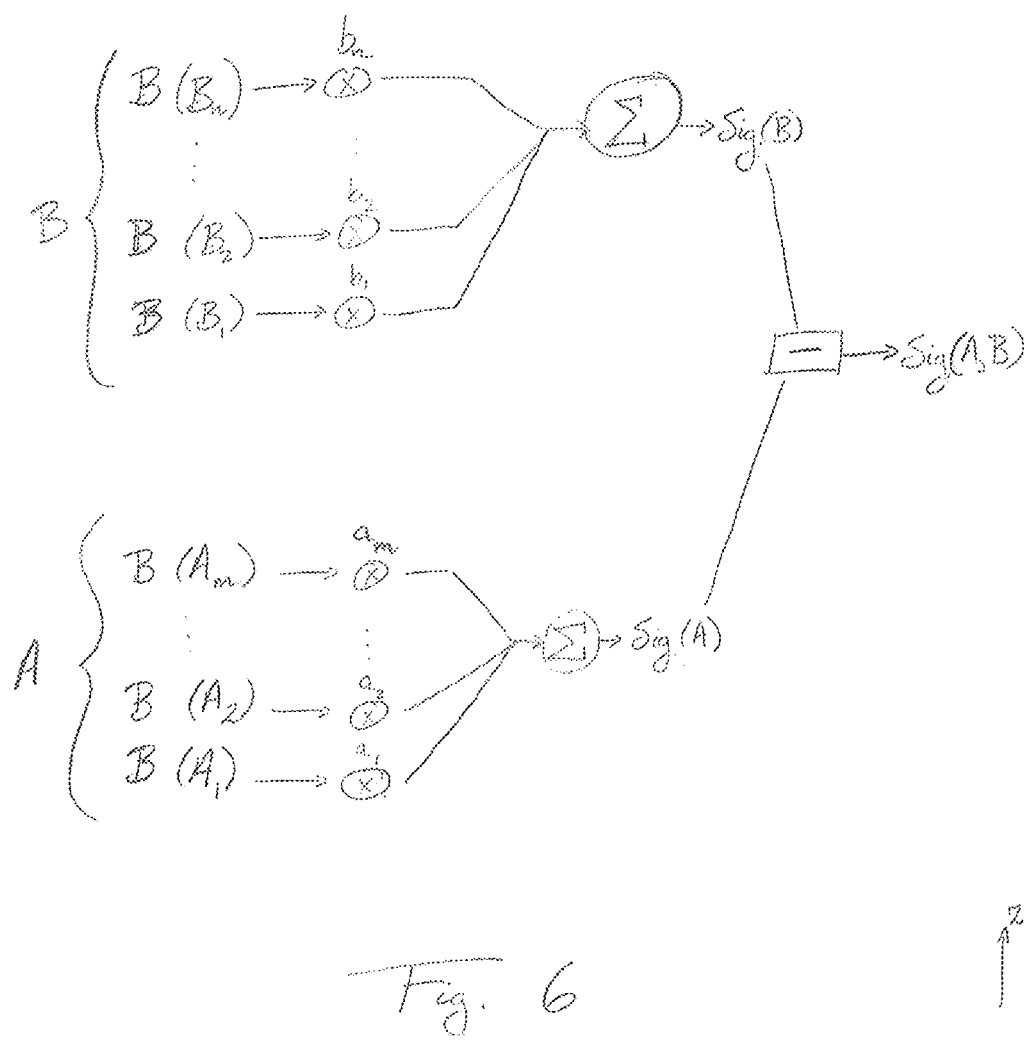
FIG. 6 is a schematic figure of a method for calculating the magnetic field contribution from a target wheel and a sensor device having many field sensors, according to an embodiment.

FIG. 6 is a schematic view of a method for calculating target contribution $B_t$ and eliminating bias contribution $B_b$ using coefficients $a_1, a_2, \ldots, a_m$ and trim coefficients $b_1, b_2, \ldots b_n$. FIG. 6 shows a generalized system including first sensor set A, each sensor of which measures the field component B and is multiplied by a coefficient a, such that a combination of measured field components of first sensor set relate to a magnetic field component at a first location and a second sensor set B, each sensor of which measures the field component B and is multiplied by a trim coefficient b such that a combination of measured field components of trimmed second sensor set relate to the same magnetic field component at a second location, which is different from the first location. Note that the combination can be a summation as indicated by the capital sigma in FIG. 6, yet in more complicated systems the combination may comprise a larger number of various computations such as the addition of constant terms and the multiplication by constant terms, or multiplications, square-roots, exponentials, goniometric formulae and all kinds of functional relationships between the individual sensor signals; the complete sequence of computations may be equivalent to an algorithm.

As indicated by the legend, top sensor set B can be further in the positive z direction than bottom sensor set A. After the sensed magnetic fields are multiplied by their weighting coefficients, they are combined to generate set signals Sig (A) and Sig(B), which represent the total field component measured by the sensors of each set, as shown in Eq. 9.

$$\begin{cases} Sig(A) = a_1 B(A_1) + a_2 B(A_2) + \ldots + a_m B(A_m) \\ Sig(B) = b_1 B(B_1) + b_2 B(B_2) + \ldots + b_n B(B_n) \end{cases} \quad [9]$$

Each of sensor sets A and B include a group of an arbitrary number of sensors. In order to cancel out homogeneous magnetic fields in the total signal Sig(A,B)=Sig(A)−Sig(B), the weighting coefficients can be selected such that $$a_1 + a_2 + \ldots + a_m = b_1 + b_2 + \ldots + b_n. \quad [10]$$

Furthermore, in order to maximize total signal, the weighed output from each field sensor within either set preferably, but not always, has the same sign, as shown in Eq. 11.

$$\begin{cases} \frac{a_1 B(S_{A,1})}{|a_1 B(S_{A,1})|} = \frac{a_2 B(S_{A,2})}{|a_2 B(S_{A,2})|} = \ldots = \frac{a_m B(S_{A,m})}{|a_m B(S_{A,m})|} \\ \frac{b_1 B(S_{B,1})}{|b_1 B(S_{B,1})|} = \frac{b_2 B(S_{B,2})}{|b_2 B(S_{B,2})|} = \ldots = \frac{b_n B(S_{B,n})}{|b_n B(S_{B,n})|} \end{cases} \quad [11]$$

For some sensors, the weighting coefficients are simply multiplied by the output of the magnetic field sensor. However, in alternative embodiments, one may also change the supply voltage/current of the sensor element by the weighting factor. Many sensor elements (such as Hall plates and Wheatstone bridge circuits of MR-sensors) have an output signal that increases as the supply increases. Thus, the output signal of each sensor element can be adjusted using a change in input voltage or current, whether linear or non-linear, or a post-hoc adjustment to the sensed field signal.

There are multiple configurations of weighting coefficients that will result in cancellation of the portion of the signals from sensor set A and sensor set B due to bias (i.e., there are multiple solutions that result in $Sig_b(A) − Sig_b(B) = 0$). Thus, two series of weighting coefficients $\{a_1, a_2, \ldots, a_m\}$ and $\{b_1, b_2, \ldots, b_n\}$ can be selected that not only cancel out bias contributions, but also maximize the signal to noise ratio (SNR) of the signal output Sig. The weighting coefficients can also be configured to minimize the effects of jitter. A wheel running at constant speed outputs a pattern of highs and lows which is periodic after one revolution. Due to mechanical vibrations, the periodic nature can be offset by a certain error, known as jitter. Weighting coefficients can be chosen that minimize the effect of jitter by maximizing the SNR.

The outputs from each sensor within the sets are combined to generate Sig(A) and Sig(B). The difference between the bias weighted output signals of sensor sets A and B, Sig(A)−Sig(B), is zero with appropriate trimming and does not change substantially with movement of the target. However, target contribution $B_t$ changes as the target moves. Thus, Sig(A)−Sig(B) becomes a non-zero signal Sig(A, B) based only on the target contribution $B_t$.

The system described with respect to FIG. 4 is one embodiment of the abstract system described schematically with respect to FIG. 6, in which each of sets A and B include only one sensor (magnetic field sensor element S2 is the only element of first set A, magnetic field sensor element S3 is the only element of top set B, and weighting coefficients $a_1 = b_1 = 1$). In an alternative embodiment weighting coefficient $b_1$ can be trimmed (e.g. between 0 and 2) in order to cancel bias magnetic field contributions in the signal Sig(A, B). If $b_1$ is different from 1 this results in poor suppression of homogeneous background magnetic disturbances, yet one may accept this drawback in order to benefit from improved bias magnetic field cancellation, which may be more important for some kinds of applications. The system described with respect to FIG. 5 is an improved embodiment, which allows one to cancel both background magnetic disturbances and bias magnetic field contributions in spite of assembly and manufacturing tolerances. Set A includes one sensor (magnetic field sensor element S4, with fixed coefficient $a_1 = 1$) and set B includes sensors at two locations (magnetic field sensor element S5 with trim coefficient $b_1 = x$, and magnetic field sensor element S6 with trim coefficient $b_2 = 1 − x$). Note that the trim coefficients are designed such that regardless of the trim value x the contribution of homogeneous background magnetic disturbances on the output signal Sig(A, B) vanishes. This is achieved by the relation $a_1 − b_1 − b_2 = 0$ for all x. Therefore x can be trimmed arbitrarily to cancel out bias magnetic field contributions in the output signal Sig(A, B) without reducing the efficiency of homogeneous background magnetic field cancellation in the output signal Sig(A, B). Increasingly complex systems can be created with arbitrarily large numbers of sensors in each of first sensor set A and second sensor set B following the trimming and combination system described schematically with respect to FIG. 6. With increasing numbers of sensors in each set, bias contribution $B_b$ is more completely and accurately eliminated from the output signal Sig, and target contribution $B_t$ is more accurately measured.

Figure 7:
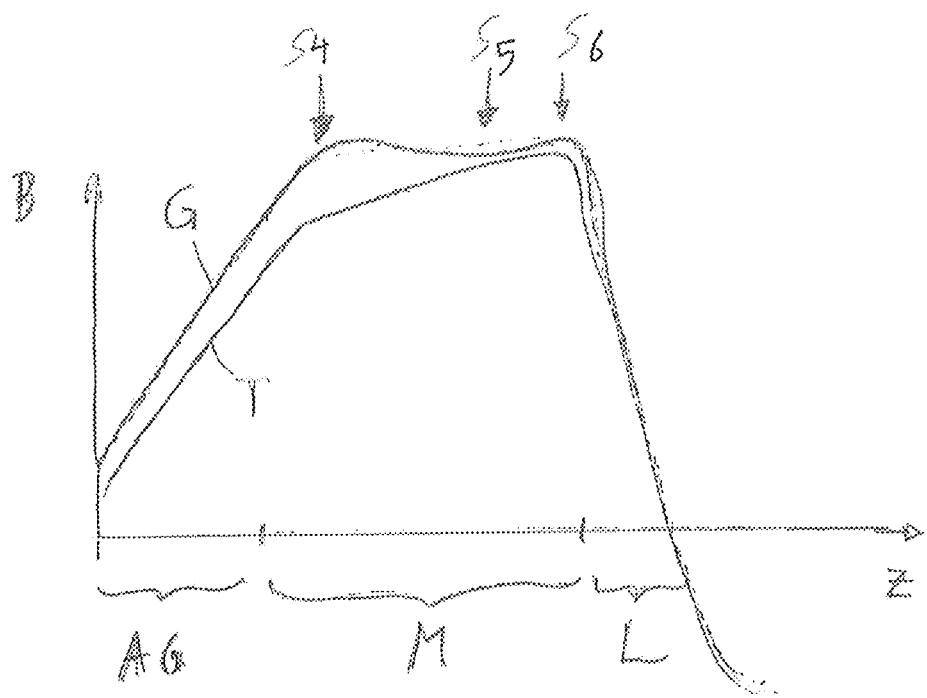
FIG. 7 is a chart illustrating magnetic field strength in the z direction B of FIG. 5 as a function of position along the z axis, according to an embodiment.

FIG. 7 is a chart illustrating the magnetic field component B of a magnetic field sensing system as a function of z-position of the test point. For ease of reference, FIG. 7 illustrates magnetic field component B for the system shown previously in FIG. 5. FIG. 7 shows magnetic field component B in air gap range AG, magnet range M, and leads range L. Tooth line T represents magnetic field component B when tooth 414T of FIG. 5 is positioned adjacent to a sensor device 412 on the z axis. Gap line G represents magnetic field component B when gap 414G of FIG. 5 is positioned adjacent to the sensor device 412 on the z axis.

As described in Eq. 4, magnetic field component B has a bias contribution $B_b$ and a target contribution $B_t$. Bias contribution $B_b$ is often orders of magnitude larger than target contribution $B_t$. Target contribution $B_t$ has its largest magnitude when tooth 414T is positioned along the z axis adjacent to sensor device 412. Likewise, the smallest magnitude of target contribution $B_t$ occurs when one of gaps 414G is positioned along the z axis adjacent to sensor device 412.

In air gap range AG, field component B rises sharply with z. In magnet range M, field component B has some dependence on z that is largely defined by the shape of the bias magnet 424 of FIG. 5. The z positions of magnetic field sensor elements S4, S5, and S6 are indicated within magnet range M. The sensors S4, S5, and S6 are arranged such that the magnetic field generated by the bias magnet on S4 is about the same as the average field on S5 and S6. In practice, there are mounting tolerances and tolerances of the magnet, such that $B_b(S4)-0.5*(B_b(S5)+B_b(S6))$ will deviate from zero. Appropriate trim values can be set such that $B_b(S4)-x*B_b(S5)-(1-x)*B_b(S6))$ becomes zero. These trim values can be found during an end-of line test after the magnet has been coupled to the sensor substrate.

Furthermore, the field component of the magnet onto S5 and S6 differs in many embodiments, such that a change in x corresponds to a change in the total signal. Thus, the magnet and the sensors S5 and S6 are often arranged such that they experience different field components from the bias magnet. In many embodiments, the field component of the bias magnet on S4 should be in-between the field components of the bias magnet on field sensors S5 and S6, because then it is theoretically possible to trim x in order to have perfect suppression of the bias field on the signal.

Because target contribution $B_t$ decays as distance between target wheel 410 and sensor device 412 increases, the difference in the strength of magnetic field B between tooth line T and gap line G is larger at lower magnetic field sensor element S4 than at middle magnetic field sensor element S5, and also larger at middle magnetic field sensor element S5 than at upper magnetic field sensor element S6. In leads range L, field strength B drops off.

In order to trim magnetic field sensor elements S4-S6 to eliminate bias contribution $B_b$ from the output signal Sig(S4, S5, S6), the measured field at middle magnetic field sensor element S5 and upper magnetic field sensor element S6 should be different from one another. Otherwise, as can be seen from Eq. 8, any change in trim factor x does not result in a change in output signal Sig(S4, S5, S6). In one embodiment, field strength B(S4) is in between field strengths B(S5) and B(S6) when trim factor x is determined. This is shown in FIG. 7 on gap line G, in which field strength B(S5)<B(S4)<B(S6).

Although FIG. 7 shows a magnetic field distribution in which B(S5)<B(S4)<B(S6), it should be apparent that an equally satisfactory system can be created in which B(S6)<B(S4)<B(S5). In that situation, field strength B(S4) is still between field strengths B(S5) and B(S6), and the benefits of the system shown in FIG. 7 are preserved.

Figure 8:
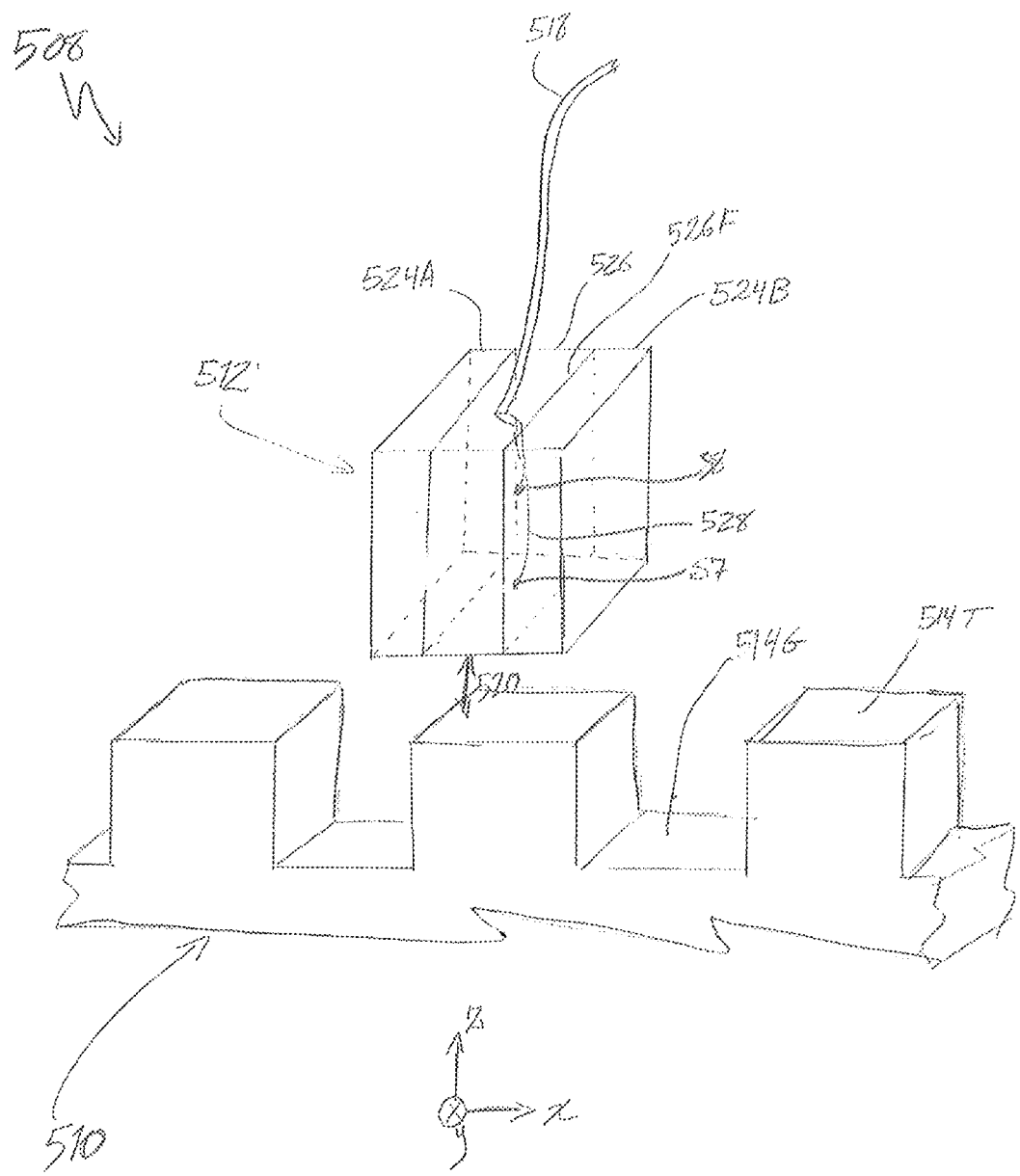
FIG. 8 is a perspective view of a twist-insensitive sensor device configuration, according to an embodiment.

FIG. 8 is a perspective view of twist-insensitive magnetic sensing system 508. Sensing system 508 includes target wheel 510 and twist-insensitive sensor device 512. Target wheel 510 includes teeth 514T that travel in the positive x direction when target wheel 510 rotates. Twist-insensitive sensor device 512 includes two magnets 524A and 524B surrounding field sensor die 526. Field sensor die 526 defines face 526F, along which bottom sensor set S7 and top sensor set S8 are arranged. Bond wires 528 electrically connect bottom sensor set S7 and top sensor set S8 to lead wires 518. Each of the sensors of bottom sensor set S7 are separated from the sensors of top sensor set S8 by a minimum spacing distance. In some embodiments, for example, the minimum distance between any pair of sensors, one in the bottom sensor set S7 and the other in the top sensor set S8, can be 300 µm.

As target wheel 510 rotates, air gap 520 changes in magnitude depending on whether one of teeth 514T or one of gaps 514G is adjacent to sensor device 512. Notably, twist-insensitive sensor device 512 can be rotated about the z axis without changing air gap 520. This type of twist insensitivity provides for more versatility for mounting.

Various alternative embodiments of twist-insensitive packages are possible. FIGS. 9A-9C are magnetic field diagrams of three such twist-insensitive packages. Each of the three contour maps shows several sensors and a magnet arranged in a twist-insensitive manner. Each of FIGS. 9A-9C is a cross-sectional view through the center of a magnet, showing a possible inner magnet form according to three embodiments.

FIG. 9A shows lower sensor set S9 and upper sensor set S10, each of which can include several magnetic field sensor elements with outputs that are combined using, for example, the system described previously with respect to FIG. 7. Lower sensor set S9 and upper sensor set S10 are positioned along centerline $C_L$. Magnet 624A generates a magnetic field in the negative z direction, and magnet 524A is radially symmetrical about centerline $C_L$. Thus, as magnet 624A is rotated about centerline $C_L$, the magnetic field in the negative z direction is unchanged.

FIG. 9B is an alternative embodiment of a twist-insensitive sensor and magnet combination. Although magnet 624B is shaped differently than magnet 624A of FIG. 9A, magnet 624B is rotationally symmetrical about centerline $C_L$, and thus the field generated in the negative z direction does not change as magnet 624B is twisted about centerline $C_L$. As shown in FIG. 9B, lower sensor set S10, middle sensor set S11, and uppers sensor set S12 are not arranged along centerline $C_L$. Rather, sensor sets S10-S12 are disposed on the edge of magnet 624B. Not all of sensor sets S10-S12 need to measure field in the z direction. For example, if sensor sets S10-S12 includes both xMR and planar Hall sensors, differential signal generation in the Hall sensors can be used to determine direction of movement of an adjacent magnetic component in a direction orthogonal to the z direction.

FIG. 9C is another alternative embodiment of a twist-insensitive sensor and magnet combination. Here, magnet 624C is shaped to not only be rotationally symmetrical about centerline $C_L$, but also to generate different fields in the negative z direction on lower sensor set S13 and upper sensor set S14. Upper sensor set S14 experiences much higher magnetic field in the negative z direction than lower sensor set S13 does. In some embodiments, such as the system described with respect to FIG. 6, this difference in bias field can be beneficial for trimming sensor output to detect the presence of an adjacent magnetic material.

It should be apparent that the embodiments described with respect to FIGS. 9A-9C are only three of an unlimited number of other twist-insensitive magnet and sensor arrangements.

FIG. 10 depicts an interdigitated field sensor system, according to another embodiment. According to the embodiment shown in FIG. 10, sensor elements S15-S22 are arranged on sensor die 1026 at various locations (L1, L2, and L3). The locations L1, L2, and L3 can each have a different air gap, or distance between each of sensor elements S15-S22 and a target that causes a target contribution to magnetic field B. In particular, the embodiment shown in FIG. 10 illustrates sensor element S15 at first location L1, sensor element S16 at second location L2, and sensor elements S17 and S18 at third location L3. Likewise, FIG. 10 illustrates sensor element S19 at first location L1, sensor element S20 at second location L2, and sensor elements S21 and S22 at third location L3.

FIG. 10 further illustrates circuitry configured to interconnect sensor elements S15-S22 in such a way that the strength of magnetic field B in the indicated direction can be ascertained. Sensor elements S15-S22 are configured in such a way as to detect the gradient of a magnetic field component along directions L1-L3 and L2-L3. L1, L2, and L3 need not be along a straight line in other embodiments, and the arrangement of these sensors could be angled with respect to their reference magnetization directions.

Input voltages V1 and V2, as well as connections to ground, are provided to drive current through sensor elements S15-S22. The sensed voltages ($S_{13}$ and $S_{23}$) correspond to the relative strength of magnetic field B at the branches of the bridge circuit, and can be adjusted by a weighting coefficient. In particular, for the embodiment shown in FIG. 10, $S_{13}=V1\ k_{13}(B(L1)-B(L3))$, and $S_{23}=V2\ k_{23}(B(L2)-B(L3))$, where $k_{13}$ and $k_{23}$ are scaling factors that take account of the magnetic sensitivity of the sensor elements. $k_{13}$ and $k_{23}$ can be identical, but if the sensor elements differ in layout, doping, size, or technology type it can be desirable to set $k_{13}$ and $k_{23}$ to be different from one another. By defining a trim coefficient x such that $$x = \frac{V2 k_{23}}{V1 k_{13}}$$

then the difference of bridge output voltages becomes identical to equation [8], namely $S_{13}-S_{23}=V1 k_{13}(B(L1)-x\ B(L2)-(1-x)B(L3))$.

In alternative embodiments, input voltages V1 and V2 can be positioned on-chip (i.e., within or on the surface of sensor die 1026).

Various embodiments of systems, devices and methods have been described herein. These embodiments are given only by way of example and are not intended to limit the scope of the invention. It should be appreciated, moreover, that the various features of the embodiments that have been described can be combined in various ways to produce numerous additional embodiments. Moreover, while various materials, dimensions, shapes, configurations and locations, etc. have been described for use with disclosed embodiments, others besides those disclosed can be utilized without exceeding the scope of the invention.

Persons of ordinary skill in the relevant arts will recognize that the invention can comprise fewer features than illustrated in any individual embodiment described above. The embodiments described herein are not meant to be an exhaustive presentation of the ways in which the various features of the invention can be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim can refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor system comprising:
a bias magnet configured to generate a bias magnetic field contribution to a total magnetic field;
at least one sensor die mechanically coupled to the bias magnet;
a first set of one or more magnetic field sensor elements arranged on the at least one sensor die, wherein each of the one or more magnetic field sensor elements of the first set is configured to sense the total magnetic field in a first direction; and
a second set of one or more magnetic field sensor elements arranged on the at least one sensor die and separated from the magnetic field sensor elements of the first set by a distance, wherein each of the one or more magnetic field sensor elements of the second set is configured to sense the total magnetic field in the first direction;
a memory configured to store a set of trim values; and
a circuitry configured to provide an output signal,
wherein the circuitry is configured to trim at least one of the sensed magnetic fields from the magnetic field sensor elements of the first and second sets with the trim values to obtain a first set output and a second set output, and to combine the first set output with the second set output to provide the output signal.

2. The sensor system of claim 1, wherein the bias magnet is radially symmetric.

3. The sensor system of claim 1, wherein the trim values are configured to minimize an effect of the bias magnetic field contribution to the output signal.

4. The sensor system of claim 1, wherein the trim values are further configured to minimize an effect of a homogeneous magnetic field contribution to the output signal.

5. The sensor system of claim 1, wherein the set of trim values is configured such that the output signal is substantially at an extremum or zero when the sensor device is in a calibration position.

6. The sensor system of claim 1, wherein the memory comprises a set of resistors having resistances corresponding to the set of trim values or a digital memory.

7. A magnetic field sensing system comprising:
at least one sensor die;
a bias magnet configured to generate a bias magnetic field contribution to a total magnetic field, the bias magnet and the at least one sensor die being mechanically coupled;
a first set of one or more magnetic field sensor elements arranged on a surface of the at least one sensor die, wherein each of the first set of one or more magnetic field sensor elements is configured to sense the total magnetic field in a first direction;
a second set of one or more magnetic field sensor elements arranged on the surface of the at least one sensor die and spaced apart from the magnetic field sensor elements of the first set, wherein each of the second set of one or more magnetic field sensor elements is configured to sense the total magnetic field in the first direction;
a memory configured to store a set of trim values;
a circuitry configured to:
combine the sensed magnetic fields from each of the one or more magnetic field sensor elements of the first set to form a first set output; and
multiply the sensed magnetic fields of at least one of the one or more magnetic field sensor elements of the second set by at least one of the set of trim values and derive a second set output therefrom; and
a target separated by a distance from the at least one field sensor dies, such that the sensed magnetic field related to the target has a first field value at the first set of one or more magnetic field sensor elements and a second field value at the second set of one or more magnetic field sensor elements.

8. The magnetic field sensing system of claim 7, wherein the target comprises portions having a relative magnetic permeability exceeding 300.

9. The magnetic field sensing system of claim 7, wherein the target has alternating magnetic north and south poles around its circumference.

10. A method of calibrating a magnetic sensor, the method comprising:
generating a first sensor set signal, comprising:
sensing a total magnetic field at each of the at least one sensors of a first sensor set; and
combining the sensed magnetic fields of the at least one sensor elements of the first sensor set to form the first sensor set signal;
generating a second sensor set signal, comprising:
sensing the total magnetic field at each of at least one sensor elements of a second sensor set;
weighting each of the sensed magnetic fields of the at least one sensor elements of the second sensor set by one of a set of trim values; and
combining the weighted magnetic fields of the at least one sensor elements of the second sensor set to form the second sensor set signal; and
combining the first sensor set signal and the second sensor set signal to generate an output signal.

11. The method of claim 10, wherein combining the first sensor set signal and the second sensor set signal comprises combining the first sensor set signal and the second sensor set signal to reduce a contribution of a homogeneous magnetic field to the output signal.

12. The method of claim 10, wherein combining the first sensor set signal and the second sensor set signal comprises combining the first sensor set signal and the second sensor set signal to reduce a direct magnetic field contribution from a bias magnet.

13. The method of claim 12, wherein the first sensor set includes a different number of sensor elements than the second sensor set.

14. The method of claim 10, and further comprising storing the set of trim values in a memory.

15. The method of claim 10, and further comprising storing the set of trim values as a set of resistance values.

16. The method of claim 10, wherein a bias magnet contribution to the total magnetic field has a different value on at least two sensor elements of the second sensor set.

17. The method of claim 10, wherein:
the first sensor set detects a first magnetic field component $B1$ of the total magnetic field at a first position;
the second sensor set detects a second magnetic field component $B2$ of the total magnetic field at a second position; and
a third sensor set detects a third magnetic field component $B3$ at a third position;
first, second, and third magnetic field components being parallel to each other;
the method further comprising:
defining a trim value x; and
combining the first, second, and third magnetic field components according to the function $B1 - x\, B2 - (1-x)\, B3$.

* * * * *